United States Patent
Yoshida

(10) Patent No.: US 11,569,597 B2
(45) Date of Patent: Jan. 31, 2023

(54) DEVICE FOR INSERTING FLEXIBLE PRINTED CIRCUIT BOARD

(71) Applicant: SAMSUNG DISPLAY CO., LTD., Yongin-si (KR)

(72) Inventor: Futoshi Yoshida, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 753 days.

(21) Appl. No.: 16/443,407

(22) Filed: Jun. 17, 2019

(65) Prior Publication Data

US 2020/0119473 A1 Apr. 16, 2020

(30) Foreign Application Priority Data

Oct. 10, 2018 (KR) .................. 10-2018-0120419

(51) Int. Cl.
*H01R 12/70* (2011.01)
*H01R 12/89* (2011.01)
*H01R 13/631* (2006.01)
*H05K 13/00* (2006.01)

(52) U.S. Cl.
CPC ......... *H01R 12/7076* (2013.01); *H01R 12/89* (2013.01); *H01R 13/631* (2013.01); *H05K 13/0015* (2013.01)

(58) Field of Classification Search
CPC ............ H05K 13/0015; H01R 12/7076; H01R 12/89; H01R 13/631
See application file for complete search history.

(56) References Cited

U.S. PATENT DOCUMENTS

| 2013/0291377 A1 | 11/2013 | Tanahashi et al. |
| 2014/0311679 A1 | 10/2014 | Kim |

FOREIGN PATENT DOCUMENTS

| CN | 201590994 U | 9/2010 |
| CN | 203934115 U | 11/2014 |
| JP | 10-093217 | 4/1998 |
| JP | 2003-43518 A | 2/2003 |
| JP | 2007-192853 A | 8/2007 |
| JP | 2011-222896 A | 11/2011 |
| JP | 2012-222096 A | 11/2012 |
| JP | 5798846 | 10/2015 |
| JP | 2016-062761 | 4/2016 |
| JP | 6015971 | 10/2016 |

(Continued)

OTHER PUBLICATIONS

Office Action dated Aug. 31, 2022 for corresponding Chinese Patent Application 201910847987.3, 8pp.

(Continued)

*Primary Examiner* — Carl J Arbes
(74) *Attorney, Agent, or Firm* — Lewis Roca Rothgerber Christie LLP

(57) ABSTRACT

A device for inserting a flexible printed circuit board into a connector of a display panel includes: a suction unit configured to adhere to the flexible printed circuit board; a position restriction unit configured to restrict a position of the flexible printed circuit board; and a flexible printed circuit board transfer unit coupled to the suction unit and the position restriction unit, and configured to insert the flexible printed circuit board into the connector. A method of inserting a flexible printed circuit board into a connector of a display panel is also disclosed.

17 Claims, 9 Drawing Sheets

(56) References Cited

FOREIGN PATENT DOCUMENTS

| KR | 10-2011-0079975 A | 7/2011 |
| KR | 2016-0071607 | 6/2016 |
| WO | 2004/1054455 A3 * | 12/2004 |

OTHER PUBLICATIONS

Search Report dated Aug. 24, 2022 for corresponding Chinese Patent Application 201910847987.3, 3pp.

\* cited by examiner

DEVICE FOR INSERTING FLEXIBLE PRINTED CIRCUIT BOARD

CROSS-REFERENCE TO RELATED APPLICATION

This application claims priority to and the benefit of Korean Patent Application No. 10-2018-0120419, filed on Oct. 10, 2018, in the Korean Intellectual Property Office, the entire content of which is incorporated by reference.

BACKGROUND

1. Field

Embodiments of the present disclosure relate to a device for inserting a flexible printed circuit board ("FPCB") and relate to a method of inserting an FPCB, and, for example, to a device for accurately inserting an FPCB to a connector of a display panel and to a method thereof.

2. Discussion of Related Art

Flexible printed circuit boards ("FPCB") are used for internal wirings of advanced electronic devices, e.g., smart phones, PDAs, notebooks, and digital cameras.

When manufacturing an FPCB, a lead plate is coupled to a front end portion of the FPCB to prevent or reduce folding or wrinkling of the FPCB when the FPCB is rolled into a transfer system in a treatment process, e.g., developing and etching. At an edge of a back end portion of the lead plate, hook pins are embedded at opposite ends in a width direction, and the FPCB and the lead plate are coupled to each other by fitting the hook pin of the lead plate into a hole defined at a front end portion of the FPCB.

Further, electronic devices are provided with elements that operate while transmitting and receiving signals to and from a controller. These elements are coupled to the controller through, for example, an FPCB, and the FPCBs are coupled to each corresponding one of the elements. In addition, a connector corresponding to the FPCB is provided as a connection unit to be coupled to the controller, such that the FPCB is coupled to the connector.

In such a structure, however, it is beneficial to hold the FPCB closely to the lead plate and to accurately align a position of the FPCB.

In addition, when the FPCB is coupled to the connector, for example, when inserting the FPCB into the connector, it is beneficial to insert a front end portion of the FPCB to an end of an insertion portion of the connector.

It is to be understood that this background section is intended to provide useful background for understanding the present disclosure and, as such, the background section may include ideas, concepts or recognitions that were not part of what was known or appreciated by those skilled in the pertinent art prior to a corresponding effective filing date of the subject matter disclosed herein.

SUMMARY

Embodiments of the present disclosure may be directed to a device for accurately inserting a flexible printed circuit board ("FPCB") into a connector of a display panel without complicated control, thereby preventing or reducing damage to the FPCB, and to a method of inserting an FPCB.

According to an embodiment, a device for inserting a flexible printed circuit board into a connector of a display panel includes: a suction unit configured to adhere to the flexible printed circuit board; a position restriction unit configured to restrict a position of the flexible printed circuit board; and a flexible printed circuit board transfer unit coupled to the suction unit and the position restriction unit, and configured to insert the flexible printed circuit board into the connector.

The flexible printed circuit board transfer unit may include: a base frame affixed to the suction unit and the position restriction unit; a transfer frame movably engaged with the base frame; a first linear guide engaged with the base frame and the transfer frame, and configured to transfer the transfer frame in a sliding manner with respect to the base frame; a transfer buffer portion between the transfer frame and the base frame, and configured to reduce a transfer force of the transfer frame; and a driver configured to provide a driving force to the transfer frame.

The transfer frame may further include a support member that protrudes from one side thereof, and the transfer buffer portion may be affixed to one end of the base frame and the support member.

The transfer buffer portion may include a spring and/or a rubber material.

The transfer buffer portion may include a hydraulic actuator and/or an air pressure actuator.

The flexible printed circuit board transfer unit may further include a second linear guide configured to receive thereon or slidingly transfer the base frame to which the suction unit and the position restriction unit are affixed.

The transfer buffer portion may have a rigidity that is less than a shear strength of the flexible printed circuit board.

The position restriction unit may include a plurality of position restriction units, and the suction unit may be located between two of the plurality of position restriction units.

A center of the suction unit may be located on a line that is substantially the same as a line on which respective centers of the plurality of the position restriction units are located.

A center of the suction unit may be located above or below a line that is substantially the same as a line on which respective centers of the plurality of the position restriction units are located.

The flexible printed circuit board may have a plurality of through holes arranged at locations respectively corresponding to central axes of the plurality of position restriction units.

Each of the position restriction units may have a diameter that is less than a width of the respective through hole.

A length of the through hole may be at least twice a diameter of the respective position restriction unit.

The flexible printed circuit board may have an open depression for accommodating the position restriction unit.

The driver may be configured to provide a movement path of the transfer frame.

The suction unit may include: a pad portion having an inlet for moving a gas; an elastic portion having a communication passage in fluid communication with the inlet, and configured to reduce movement of the pad portion due to a gas moving force; and a vacuum generator configured to generate a vacuum to introduce the gas through the inlet and the communication passage.

The suction unit may include: a suction member including a suction surface on one side thereof and a suction electrode on another side thereof; a suction substrate spaced apart from the suction member, and configured to be charged with a polarity that is opposite to a polarity of the suction electrode; and a suction power unit configured to apply a set or predetermined voltage to between the suction substrate and the suction member. The suction unit may include: when the flexible printed circuit board is located between the suction member and the suction substrate and the set or predetermined voltage is applied from the suction power unit to between the suction electrode and the suction substrate, a positive charge is generated at the suction member, a negative charge is generated at the suction substrate, the suction surface of the suction member and the suction substrate are constrained by Coulomb's force, and the suction substrate is adhered to and held on the suction surface of the suction member.

According to an embodiment, a method of inserting a flexible printed circuit board into a connector of a display panel includes: (a) adhering the flexible printed circuit board to a suction unit sucking the flexible printed circuit board, and wherein a position restriction unit of the suction unit is inserted into a through hole or an open depression of the flexible printed circuit board; (b) restricting a position of the flexible printed circuit board by alternately adhering and unadhering the flexible printed circuit board to the position restriction unit of the suction unit; and (c) inserting the flexible printed circuit board into the connector of the display panel by utilizing a flexible printed circuit board transfer unit.

The inserting of the flexible printed circuit board into the connector of the display panel may include: providing a driving force from a driver to a transfer frame; the transfer frame and a base frame being engaged with the transfer frame to move in a sliding manner toward the connector; and the suction unit and the position restriction unit being affixed to the base frame to move in a similar manner as the base frame, and reducing a transfer force of the transfer frame by utilizing a transfer buffer portion when insertion of the flexible printed circuit board, which is adhered to the suction unit, to the connector is completed; and allowing the transfer frame to slide with respect to the base frame along a first linear guide.

The transfer buffer portion may have a rigidity that is less than a shear strength of the flexible printed circuit board, the shear being strength capable of generating deformation in a direction perpendicular (e.g., substantially perpendicular) to a compressive force when the compressive force is applied to the flexible printed circuit board.

The transfer buffer portion may reduce the transfer force of the transfer frame such that an insertion force of the flexible printed circuit board is less than a deformation force of the flexible printed circuit board at the side of the connector.

The restricting of the position of the flexible printed circuit board may include: restricting the position of the flexible printed circuit board in a state where there is no further movement of the position restriction unit in the through hole or the open depression toward the connector.

The foregoing is illustrative only and is not intended to be in any way limiting. In addition to the illustrative aspects and features of embodiments described herein above, further aspects and features of embodiments will become apparent by reference to the drawings and the following detailed description.

BRIEF DESCRIPTION OF THE DRAWINGS

A more complete appreciation of the subject matter of the present disclosure will become more apparent from the following description of embodiments of the present disclosure with reference to the accompanying drawings, in which.

DETAILED DESCRIPTION

Figure 1:
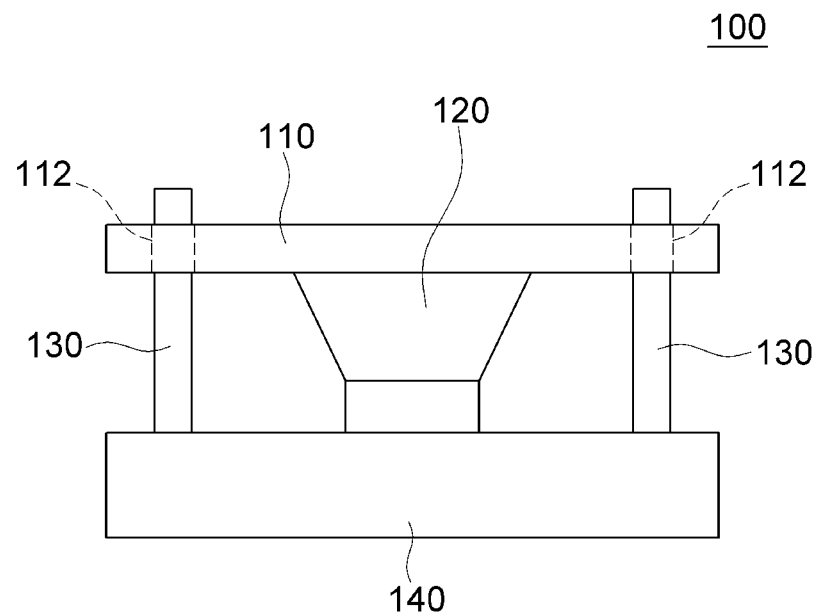
FIG. 1 is a block diagram schematically illustrating an overall configuration of a device for inserting a flexible printed circuit board ("FPCB") according to an embodiment.

Embodiments of the present disclosure will now be described more fully hereinafter with reference to the accompanying drawings. Although the subject matter of the present disclosure may be modified in various suitable ways and have several embodiments, example embodiments are illustrated in the accompanying drawings and will be mainly described in the specification. However, the scope of the present disclosure is not limited to the embodiments described and should be construed as including all the changes, equivalents and substitutions included in the spirit and scope of the present disclosure.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in a case where a device illustrated in the drawing is turned over, the device positioned "below" or "beneath" another device may be placed "above" another device. Accordingly, the illustrative term "below" may include both the lower and upper positions. The device may also be oriented in the other direction, and thus, the spatially relative terms may be interpreted differently depending on the orientations.

Throughout the specification, when an element is referred to as being "coupled" or "connected" to another element, the element may be "indirectly coupled" or "indirectly connected" to the other element, "directly coupled" or "directly connected" to the other element, or "electrically coupled" or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. Additionally, it will be understood that, as used herein, the term "exemplary" is intended to refer to an example or illustration.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts or components that are not associated with the description may not be provided or described in order to more clearly describe embodiments of the present disclosure. Like reference numerals refer to like elements throughout the specification.

Hereinafter, embodiments of the present disclosure will be described with reference to FIGS. 1-13.

FIG. 1 is a block diagram schematically illustrating an overall configuration of a device for inserting a flexible printed circuit board ("FPCB") according to an embodiment.

Referring to FIG. 1, an FPCB inserting device 100 according to an embodiment includes a device for inserting an FPCB 110 to a connector 105 (shown in FIGS. 9-12). The FPCB inserting device 100 may include a suction unit 120, a position restriction unit 130, and an FPCB transfer unit 140.

Figure 3:
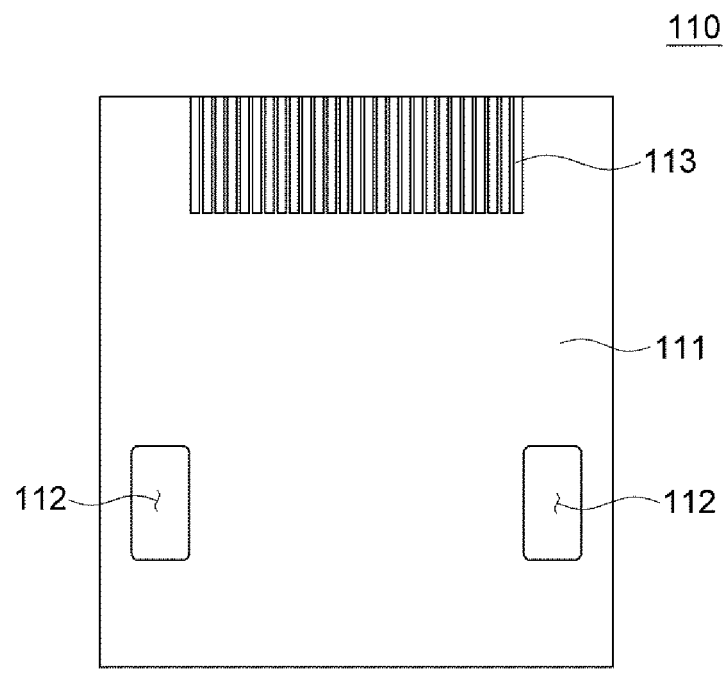
FIG. 3 is a view illustrating an FPCB having a through hole according to an embodiment.

The FPCB 110 may have a plurality of through holes 112 located at positions corresponding to center axes of the position restriction units 130, as shown in FIG. 3.

In some embodiments, at the FPCB 110, a conductor is formed as a connection pattern 113 on a base film 111 that is an insulator (e.g., an electrical insulator), a coverlay that is an insulator (e.g., an electrical insulator) is attached thereon, and the plurality of through holes 112 may be defined at opposite end portions in a width direction on the opposite side of the connection pattern 113. The position restriction units 130, each having a circular rod shape, may be inserted into the plurality of through holes 112 and fitted thereto. The shape of the position restriction units 130 is not limited to a circular rod shape.

Figure 4:
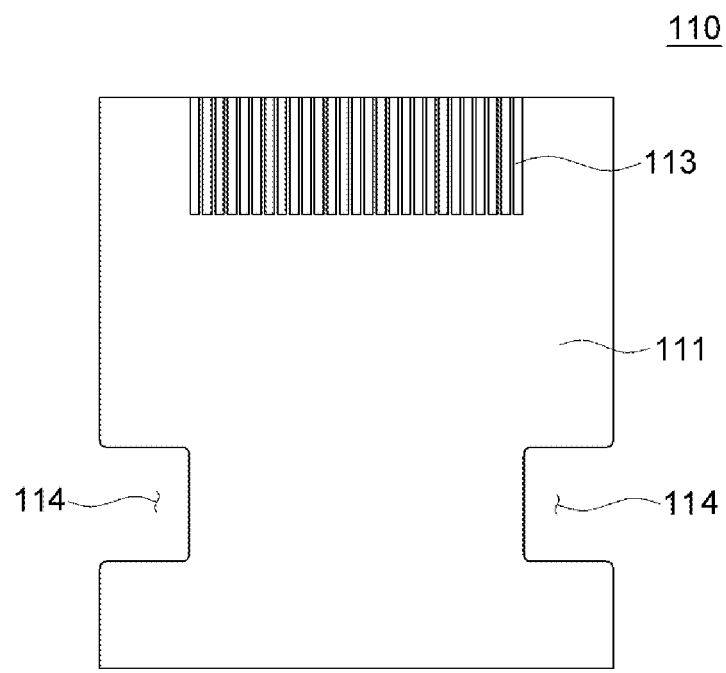
FIG. 4 is a view illustrating an FPCB having an open depression according to an embodiment.

In addition or alternatively, the FPCB 110 may have a plurality of open depressions 114 located at positions corresponding to the center axes of the position restriction units 130, as shown in FIG. 4. Each of the plurality of open depressions 114 may have a notch shape, and may be in a shape recessed from one side of the FPCB 110. The shape of the plurality of open depressions 114 is not limited to a notch shape.

The suction unit 120 may suck (e.g., adhere) the FPCB 110 to the suction unit 120 in a vacuum scheme or an electrostatic scheme. The vacuum scheme and the electrostatic scheme will be described hereinbelow with reference to FIGS. 7 and 8.

The position restriction unit 130 may restrict a position of the FPCB 110. In some embodiments, when the FPCB 110 is sucked (e.g., adhered) to the suction unit 120, the position restriction unit 130 may be inserted into the through hole 112 or the open depression 114 of the FPCB 110, and fitted with (e.g., affixed to) the FPCB 110.

For example, in an embodiment, the position restriction unit 130 may have a circular rod shape and may have a diameter that is less than a width of the through hole 112 or a diameter that is less than a width of the open depression 114. The position restriction unit 130 is not limited to a circular rod shape. In such an embodiment, a length of the through hole 112 may be at least twice the diameter of the position restriction unit 130, and a length of the open depression 114 may be at least twice the diameter of the position restriction unit 130 as well.

The FPCB transfer unit 140 may be coupled to the suction unit 120 and the position restriction unit 130, and may insert the FPCB 110 into the connector 105. In some embodiments, the FPCB transfer unit 140 may transfer, in a sliding manner, the FPCB 110 that is sucked by (e.g., adhered to) the suction unit 120 and fitted to (e.g., affixed to) the position restriction unit 130 through the through hole 112, and may insert the FPCB 110 into the connector 105.

Figure 2:
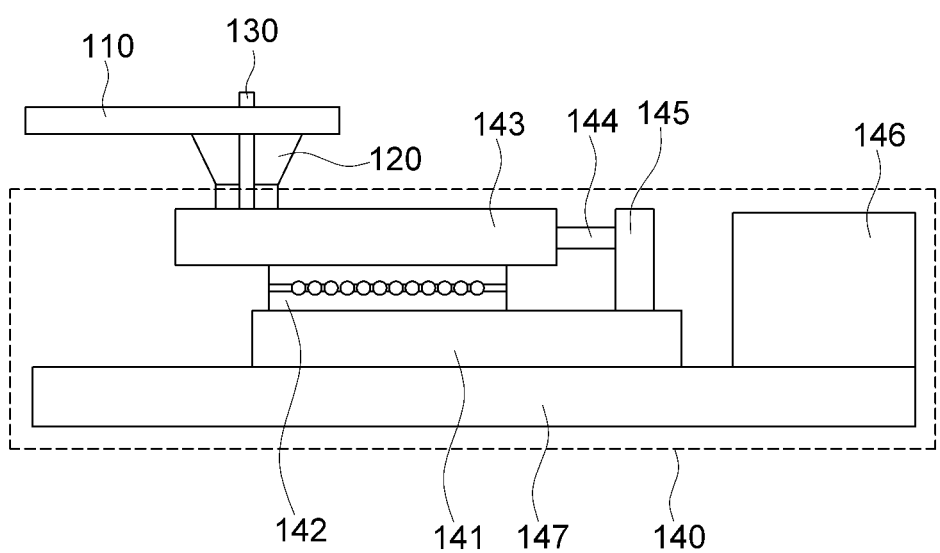
FIG. 2 is a view illustrating an example structure of an FPCB transfer unit of FIG. 1.

FIG. 2 is a view illustrating an example structure of an FPCB transfer unit of FIG. 1.

Referring to FIG. 2, the FPCB transfer unit 140 according to an embodiment includes a transfer frame 141, a first linear guide 142, a base frame 143, a transfer buffer portion 144, and a driver 146.

The transfer frame 141 may move toward the connector 105 along a movement path 147 provided by the driver 146. The transfer frame 141 may be coupled on one side to the base frame 143 through the first linear guide 142. In some embodiments, the transfer frame 141 may be slidably engaged with the base frame 143 through the first linear guide 142.

The base frame 143 may fix (e.g., affix) the suction unit 120 and the position restriction unit 130 on one side thereof. Accordingly, when the base frame 143 slides toward the connector 105, the suction unit 120, to which the FPCB 110 is sucked (e.g., adhered), and the position restriction unit 130, to which the FPCB 110 is fitted through the through hole 112, may also slide toward the connector 105 similarly to the movement of the base frame 143.

The transfer frame 141 may further include a support member 145 protruding from one side thereof, and the transfer buffer portion 144 may be fixed to (e.g., affixed to) one end of the base frame 143 and the support member 145.

The first linear guide 142 may couple the base frame 143 and the transfer frame 141, and may allow the transfer frame 141 to move in a sliding manner with respect to the base frame 143. In some embodiments, at a point in time at which insertion of the FPCB 110 to the connector 105 is completed by the sliding movement of the transfer frame 141 and the base frame 143, transfer of the base frame 143 is stopped, and the first linear guide 142 may allow the transfer frame 141 to slide relative to the base frame 143

The transfer buffer portion 144 may be between the transfer frame 141 and the base frame 143, and reduce a transfer force of the transfer frame 141. The transfer buffer portion 144 may include a spring and/or a rubber material, but the present disclosure is not limited thereto. The transfer buffer portion 144 may include a hydraulic actuator and/or an air pressure actuator, for example, but the present disclosure is not limited thereto.

The driver 146 may provide the movement path 147 of the transfer frame 141 and may provide a driving force to the transfer frame 141. In another exemplary embodiment, the driver 146 may be implemented, for example, as a robot arm, and may provide a driving force to the transfer frame 141 without providing the movement path 147.

Figure 5:
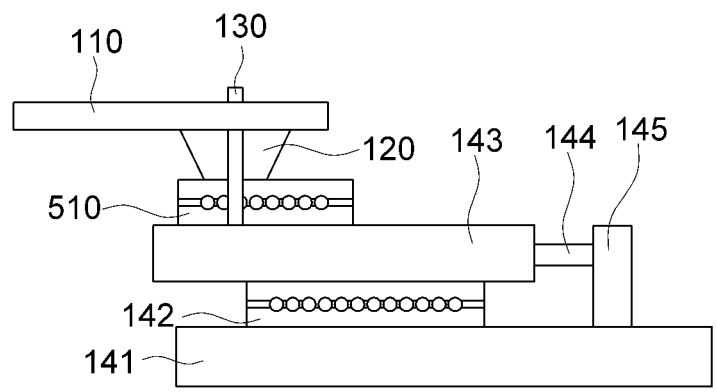
FIG. 5 is a view illustrating a structure of an FPCB transfer unit coupled to a suction unit and a position restriction unit according to another embodiment.

FIG. 5 is a view illustrating a structure of an FPCB transfer unit coupled to a suction unit and a position restriction unit according to another embodiment.

Referring to FIG. 5, an FPCB transfer unit 140 according to this embodiment may further include a second linear guide 510 for placing thereon or for slidingly transferring the base frame 143 to which the suction unit 120 and the position restriction unit 130 are fixed.

The second linear guide 510 may be between the suction unit 120 and the base frame 143, and may couple the suction unit 120 and the base frame 143 while substantially maintaining a state in which the position restriction unit 130 and the base frame 143 are fixed to each other.

The transfer buffer portion 144 coupled to one side of the base frame 143 and the support member 145 of the transfer frame 141 may have a rigidity that is less than a shear strength of the FPCB 110.

As used herein, the term "shear strength of the FPCB 110" refers to a strength that causes deformation in a direction perpendicular (e.g., substantially perpendicular) to a compressive force when the FPCB 110 receives the compressive force, and the term "rigidity of the transfer buffer portion 144" refers to a minimum strength at which displacement of the transfer buffer portion 144 is caused in a direction substantially the same as a direction of an external force.

The first linear guide 142 or the second linear guide 510 may move in a direction parallel (e.g., substantially parallel) to a direction of inserting the FPCB 110, and a force required for the movement may be imparted by an actuator, e.g., a spring and/or an air cylinder.

Figure 6:
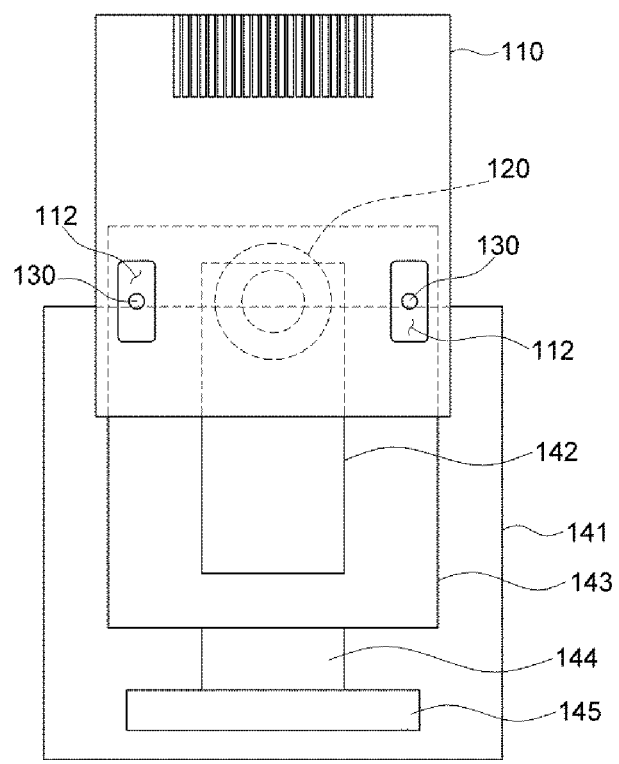
FIG. 6 is a view illustrating a coupling state of an FPCB, a suction unit, a position restriction unit, and an FPCB transfer unit according to an embodiment.

FIG. 6 is a view illustrating a coupling state of an FPCB, a suction unit, a position restriction unit, and an FPCB transfer unit according to an embodiment.

Referring to FIG. 6, the FPCB 110 according to an embodiment may be sucked to (e.g., adhered to) the suction unit 120, and may be fitted to the position restriction unit 130 through the through hole 112.

In such an embodiment, it may be appreciated that the suction unit 120 and the position restriction unit 130 are fixed to (e.g., affixed to) the base frame 143, and the base frame 143 is engaged with the transfer frame 141 through the first linear guide 142.

The suction unit 120 may be located between two circular rods of the position restriction unit 130. A center of the suction unit 120 may be located on a line that is the same (e.g., substantially the same) as a line on which a center of the position restriction unit 130 is located. However, embodiments of the present disclosure are not limited thereto, and the center of the suction unit 120 may be located above or below the line on which the center of the position restriction unit 130 is located.

The position restriction unit 130 may have a diameter that is less than the width of the through hole 112, and the length of the through hole 112 may be at least twice the diameter of the position restriction unit 130. As described herein, the width of the through hole 112 and the length of the through hole 112 may each be substantially parallel to a plane in which the FPCB lies and/or may each be substantially perpendicular to a direction in which the position restriction unit 130 extends.

In some embodiments, two position restriction units 130, each having a circular rod shape, are fixed to (e.g., affixed to) the base frame 143 at such a location that the FPCB 110, fitted to the position restriction units 130 through the through hole 112, may be accurately inserted into the connector 105.

Before the FPCB 110 is inserted into the connector 105, there may be a clearance between the position restriction unit 130 and the FPCB 110. However, the position restriction unit 130 moves and finally stops moving in the through hole 112 due to sucking and unsucking (e.g., adhering and unadhering) actions of the suction unit 120 on the FPCB 110, and thus, the position of the FPCB 110 may be restricted.

Figure 7:
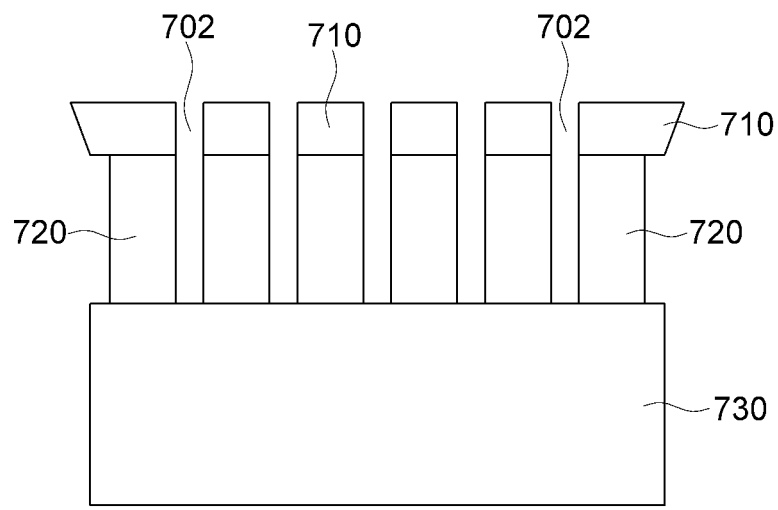
FIG. 7 is a view illustrating an exemplary embodiment in which a suction unit is a vacuum type (or kind)

FIG. 7 is a view illustrating an exemplary embodiment in which a suction unit is a vacuum type (or kind).

Referring to FIG. 7, the suction unit 120 according to the present embodiment may include a pad portion 710, an elastic portion 720, and a vacuum generator 730.

At the pad portion 710, a plurality of inlets 702 for sucking air (e.g., for moving a gas) may be defined.

The elastic portion 720 may be provided with a communication passage 722 that communicates with (e.g., is in fluid communication with) the inlet 702, and reduce movement of the pad portion 710 due to a sucking force.

The vacuum generator 730 may generate a vacuum, and introduce air (e.g., a gas) through the inlet 702 and the communication passage 722.

When the suction unit 120, having the above-described structure, starts operating, a vacuum is generated at the vacuum generator 730, and air is introduced (e.g., a gas is moved) through the inlet 702 and the communication passage 722. The FPCB 110 is sucked to the pad portion 710 according to the inflow of air.

Figure 8:
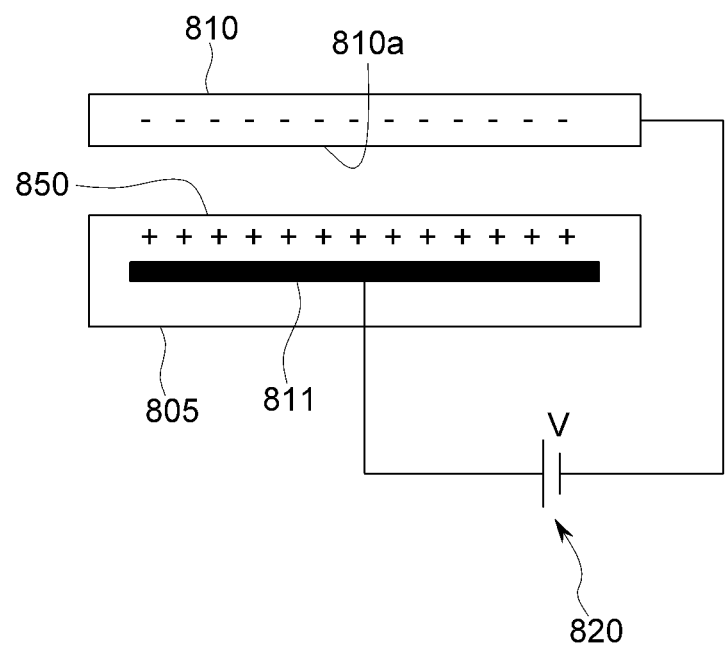
FIG. 8 is a view illustrating an exemplary embodiment in which a suction unit is an electrostatic type (or kind)

FIG. 8 is a view illustrating an exemplary embodiment in which a suction unit is an electrostatic type (or kind).

Referring to FIG. 8, the suction unit 120 according to the present embodiment may include a suction member 805, a suction substrate 810, and a suction power unit 820.

The suction member 805 may include a suction surface 850 on one side thereof, and include a suction electrode 811 on another side thereof.

The suction substrate 810 may be spaced apart from the suction member 805, and charged with a polarity opposite to a polarity of the suction electrode 811. In an embodiment, for example, when a positive charge (+) is imparted to the suction electrode 811, a negative charge (−) may be imparted to the suction substrate 810.

The suction power unit 820 may apply a set or predetermined voltage to between the suction substrate 810 and the suction member 805.

The suction unit 120, having the above-described structure, is configured such that the FPCB 110 is located between the suction member 805 and the suction substrate 810 and a set or predetermined voltage is applied from the suction power unit 820 to between the suction electrode 811 and the suction substrate 810.

Accordingly, a positive charge is imparted to the suction electrode 811 of the suction member 805, and a negative charge is imparted to the suction substrate 810.

The suction surface 850 of the suction member 805 and the suction substrate 810 are constrained by Coulomb's force such that the suction substrate 810 is sucked (e.g., adhered to) and held on the suction surface 850 of the suction member 805.

Accordingly, the FPCB 110 located between the suction member 805 and the suction substrate 810 is sucked to (e.g., adhered to) the suction unit 120 by the process described herein above.

Figure 13:
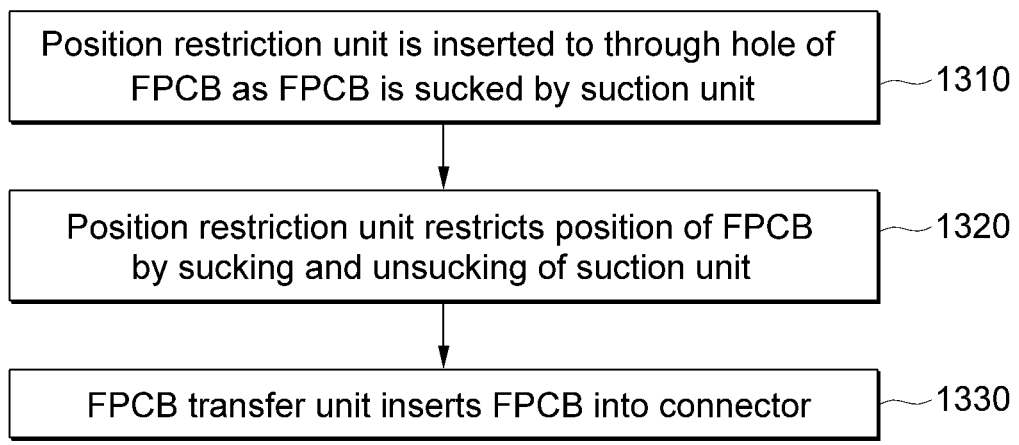
FIG. 13 is a flowchart illustrating a method of inserting an FPCB according to an embodiment.

FIGS. 9-12 are views illustrating a process of inserting an FPCB into a connector according to an embodiment, and FIG. 13 is a flowchart illustrating a method of inserting an FPCB according to an embodiment.

Referring to FIGS. 9-13, as the suction unit 120 sucks (e.g., adheres) the FPCB 110, the position restriction unit 130 is inserted into the through hole 112 or the open depression 114 of the FPCB 110 (1310).

Figure 9:
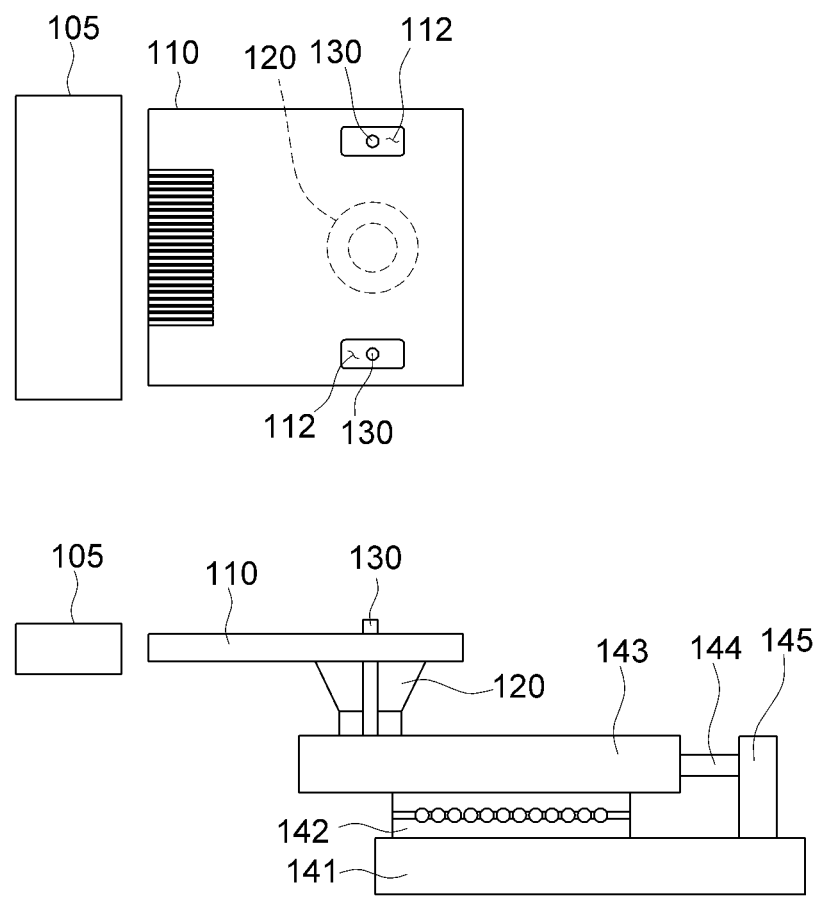
FIGS. 9-12 are views illustrating a process of inserting an FPCB into a connector according to an embodiment.

At the FPCB inserting device 100 according to an embodiment, as shown in FIG. 9, the FPCB 110 is spaced apart from the connector 105 by a set or predetermined distance. As the FPCB 110 is sucked to (e.g., adhered to) the suction unit 120, the FPCB 110 is fitted to (e.g., affixed to) the position restriction unit 130 through the through hole 112.

In such an embodiment, the suction unit 120 and the position restriction unit 130 are in a state of being fixed to (e.g., affixed to) one side of the base frame 143. The base frame 143 is engaged with the transfer frame 141 through the first linear guide 142, and the transfer buffer portion 144 is coupled between one end of the base frame 143 and the support member 145 of the transfer frame 141.

Figure 10:
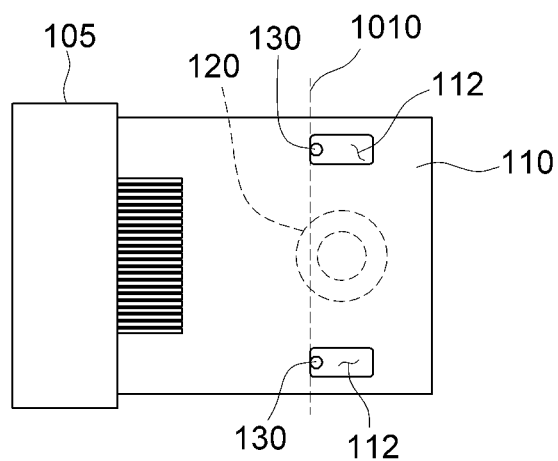
Figure 10:
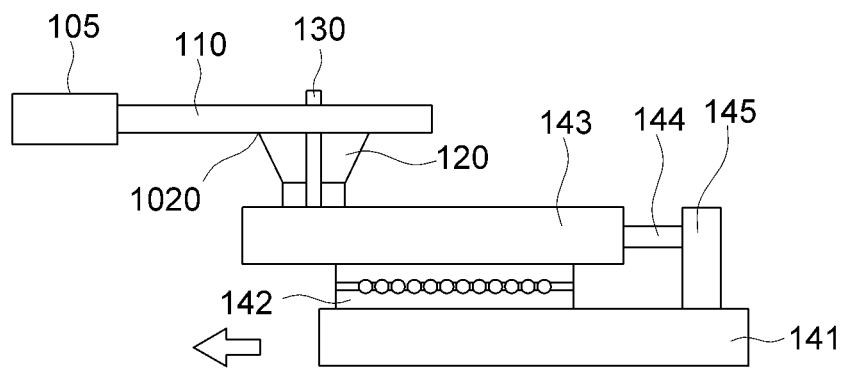

Next, the position restriction unit 130 restricts the position of the FPCB 110 by sucking and unsucking of (e.g., by alternately adhering and unadhering) the suction unit 120 on the FPCB 110, as illustrated in FIG. 10 (1320).

The suction unit 120 repeats sucking and unsucking (temporary release of sucking; e.g., alternately adhering and unadhering the FPCB 110) on the FPCB 110 in a state where the position restriction unit 130 is inserted into the through hole 112 or the open depression 114 of the FPCB 110. Accordingly, as illustrated in FIG. 10, the position restriction unit 130 slips in the through hole 112 or the open depression 114 to a position restriction line 1010 toward the connector 105, and also reaches the FPCB 110, and thus, the position of the FPCB 110 is restricted such that there is no further movement (or substantially no further movement).

In such a position restriction state of the FPCB 110 where there is no further movement of the position restriction unit 130 in the through hole 112, the driver 146 provides a driving force to the transfer frame 141. For example, when the position restriction unit 130 that is fitted to the FPCB 110 through the through hole 112 slips and reaches the position restriction line 1010, the FPCB transfer unit 140 provides a driving force to the transfer frame 141 by the driver 146 to start an insertion operation of the FPCB 110.

Subsequently, the FPCB transfer unit 140 inserts the FPCB 110 into the connector (1330).

Figure 11:
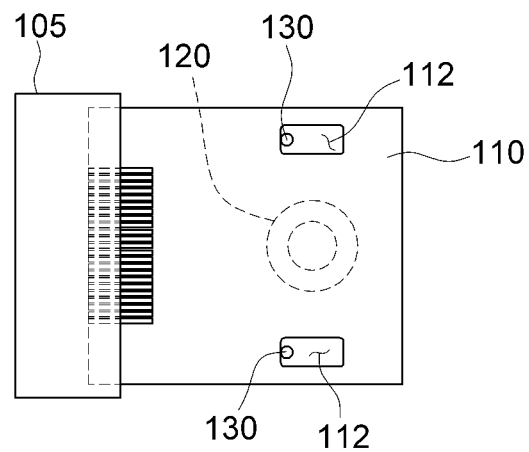
Figure 11:
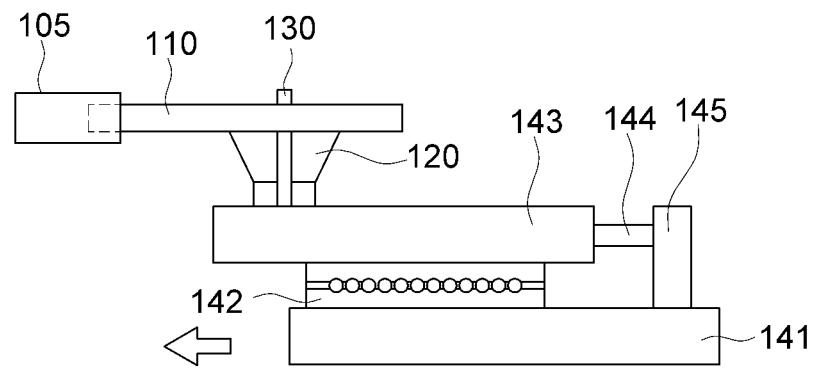
Figure 12:
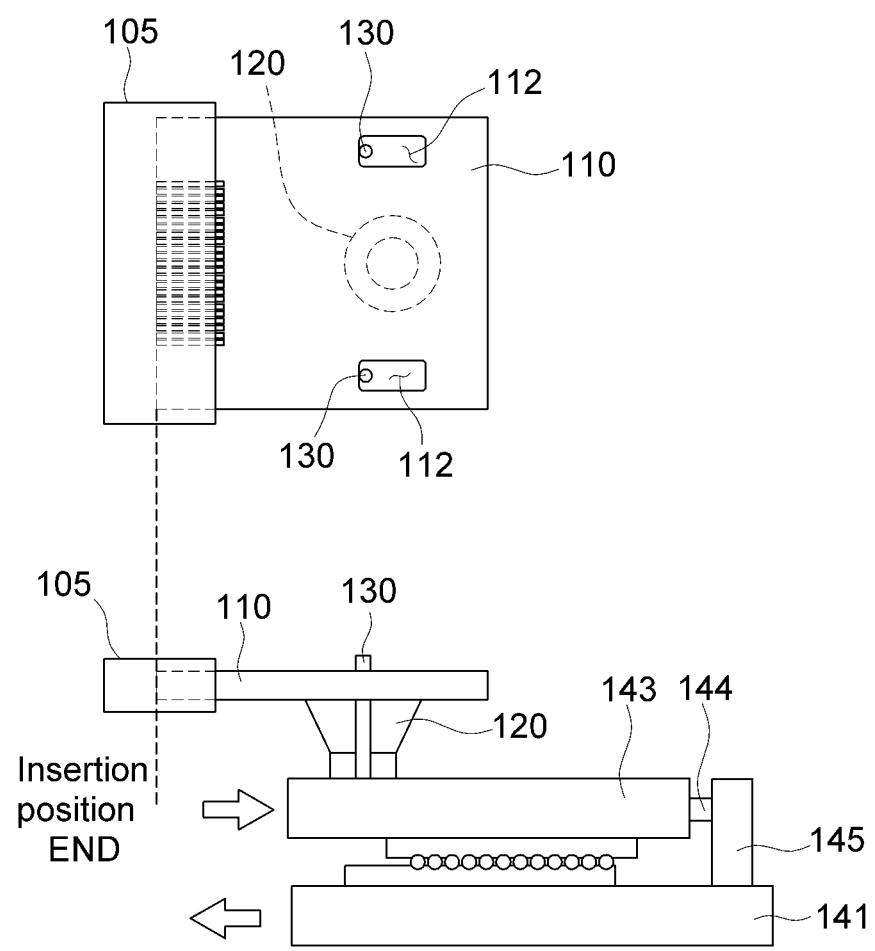

For example, as the driver 146 provides a driving force to the transfer frame 141 at the FPCB transfer unit 140, the transfer frame 141 slides toward the connector 105, as shown in FIG. 11.

In such an embodiment, the base frame 143 engaged with the transfer frame 141 slides along with the transfer frame 141 toward the connector 105, and the suction unit 120 and the position restriction unit 130 fixed to (e.g., affixed to) the base frame 143 slide in a similar manner.

Accordingly, the FPCB 110 that is sucked to (e.g., adhered to) the suction unit 120 is inserted into the connector 105, as shown in FIG. 11.

Subsequently, as the FPCB 110 that is sucked to (e.g., adhered to) the suction unit 120 is inserted into the connector 105, when an end of the FPCB 110 reaches an insertion end position 1020 that is in the connector 105, insertion of the FPCB 110 into the connector 105 is completed. When the insertion of the FPCB 110 into the connector 105 is completed, the FPCB 110 stops moving.

As the FPCB 110 stops moving, the suction unit 120 to which the FPCB 110 is sucked (e.g., adhered) also stops the sliding movement, and the position restriction unit 130 that is fitted to the FPCB 110 through the through hole 112 also stops the sliding movement.

At this time, the transfer frame 141 continuously (e.g., substantially continuously) slides toward the connector 105 according to an inertia force that is caused based on the sliding movement toward the connector 105. On the other hand, the base frame 143 to which the suction unit 120 and the position restriction unit 130 are fixed (e.g., affixed) stops the sliding movement. The first linear guide 142 allows the transfer frame 141 to move in a sliding manner relative to the base frame 143, which has stopped moving.

The transfer buffer portion 144 coupled between one end of the base frame 143 and the support member 145 of the transfer frame 141 reduces a transfer force of the transfer frame 141. For example, the transfer buffer portion 144 reduces the transfer force of the transfer frame 141 such that an insertion force of the FPCB 110 is less than a deformation force of the FPCB 110 at the side of the connector 105.

In such an embodiment, the transfer buffer portion 144 may have a rigidity that is less than a shear strength of the FPCB 110, where the term "the shear strength of the FPCB 110," as used herein, refers to a strength at which deformation of the FPCB 110 is caused in a direction perpendicular (e.g., substantially perpendicular) to a compressive force when the FPCB 110 reaches the insertion end position 1020 in the connector 105 and receives the compressive force.

A force for sliding the transfer frame 141 using the first linear guide 142 with respect to the base frame 143 may be set to be less than a deformation force at an insertion completion time of the FPCB 110 and greater than a force required for inserting the FPCB 110 to the connector 105.

Accordingly, even if the transfer frame 141 continues to slide and overrun after the insertion of the FPCB 110 is completed, deformation of or damage to the FPCB may be substantially prevented or reduced.

As set forth hereinabove, according to one or more embodiments of the present disclosure, a device for inserting an FPCB may accurately insert an FPCB to a connector of a display panel without complicated control, and thus, breakage of the FPCB due to overrun at an insertion completion position of the FPCB may be substantially prevented or reduced.

While the subject matter of the present disclosure has been illustrated and described with reference to embodiments thereof, it will be apparent to those of ordinary skill in the art that various changes in form and detail may be made thereto without departing from the spirit and scope of the present disclosure.

What is claimed is:

1. A device for inserting a flexible printed circuit board into a connector of a display panel, the device comprising:
    a suction unit configured to adhere to the flexible printed circuit board;
    a position restriction unit configured to restrict a position of the flexible printed circuit board; and
    a flexible printed circuit board transfer unit coupled to the suction unit and the position restriction unit, and configured to insert the flexible printed circuit board into the connector.

2. The device of claim 1, wherein the flexible printed circuit board transfer unit comprises:
    a base frame affixed to the suction unit and the position restriction unit;
    a transfer frame movably engaged with the base frame;
    a first linear guide engaged with the base frame and the transfer frame, and configured to transfer the transfer frame in a sliding manner with respect to the base frame;
    a transfer buffer portion between the transfer frame and the base frame, and configured to reduce a transfer force of the transfer frame; and
    a driver configured to provide a driving force to the transfer frame.

3. The device of claim 2, wherein the transfer frame further comprises a support member that protrudes from one side thereof, and
    the transfer buffer portion is affixed to one end of the base frame and the support member.

4. The device of claim 3, wherein the transfer buffer portion comprises a spring and/or a rubber material.

5. The device of claim 3, wherein the transfer buffer portion comprises a hydraulic actuator and/or an air pressure actuator.

6. The device of claim 2, wherein the flexible printed circuit board transfer unit further comprises a second linear guide configured to receive thereon or slidingly transfer the base frame to which the suction unit and the position restriction unit are affixed.

7. The device of claim 2, wherein the transfer buffer portion has a rigidity that is less than a shear strength of the flexible printed circuit board.

8. The device of claim 1, wherein the position restriction unit comprises a plurality of position restriction units, and
    wherein the suction unit is located between two of the plurality of the position restriction units.

9. The device of claim 8, wherein a center of the suction unit is located on a line that is the same as a line on which respective centers of the plurality of the position restriction units are located.

10. The device of claim 8, wherein a center of the suction unit is located above or below a line that is the same as a line on which respective centers of the plurality of the position restriction units are located.

11. The device of claim 1, wherein the position restriction unit comprises a plurality of position restriction units, and
    wherein the flexible printed circuit board has a plurality of through holes arranged at locations respectively corresponding to central axes of the plurality of position restriction units.

12. The device of claim 11, wherein each of the position restriction units has a diameter that is less than a width of the respective through hole.

13. The device of claim 11, wherein a length of the through hole is at least twice a diameter of the respective position restriction unit.

14. The device of claim 1, wherein the flexible printed circuit board has an open depression for accommodating the position restriction unit.

15. The device of claim 2, wherein the driver is configured to provide a movement path of the transfer frame.

16. The device of claim 1, wherein the suction unit comprises:
    a pad portion having an inlet for moving a gas;
    an elastic portion having a communication passage in fluid communication with the inlet, and configured to reduce movement of the pad portion due to a gas moving force; and
    a vacuum generator configured to generate a vacuum to introduce the gas through the inlet and the communication passage.

17. The device of claim 1, wherein the suction unit comprises:
    a suction member comprising a suction surface on one side thereof and a suction electrode on another side thereof;
    a suction substrate spaced apart from the suction member, and configured to be charged with a polarity that is opposite to a polarity of the suction electrode; and
    a suction power unit configured to apply a set voltage to between the suction substrate and the suction member, and
    wherein, when the flexible printed circuit board is located between the suction member and the suction substrate and the set voltage is applied from the suction power unit to between the suction electrode and the suction substrate, a positive charge is generated at the suction member, a negative charge is generated at the suction substrate, the suction surface of the suction member and the suction substrate are constrained by Coulomb's force, and the suction substrate is adhered to and held on the suction surface of the suction member.

* * * * *